(12) United States Patent
Dehlinger (10) Patent No.: US 7,982,281 B2
(45) Date of Patent: Jul. 19, 2011

(54) METHOD OF MANUFACTURING A SEMICONDUCTOR DEVICE, METHOD OF MANUFACTURING A SOI DEVICE, SEMICONDUCTOR DEVICE, AND SOI DEVICE

(75) Inventor: Gabriel Dehlinger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 309 days.

(21) Appl. No.: 11/828,268

(22) Filed: Jul. 25, 2007

(65) Prior Publication Data
US 2009/0026572 A1    Jan. 29, 2009

(51) Int. Cl.
*H01L 21/40* (2006.01)

(52) U.S. Cl. .............. 257/508; 257/347; 257/E29.287; 438/149; 438/295; 438/311

(58) Field of Classification Search ........... 257/E21.235, 257/E21.024, E21.035, 508, 347–354, E29.287; 438/149–166, 295, 311, 404–413, 458–459, 438/479–481, 967, 257
See application file for complete search history.

(56) References Cited

U.S. PATENT DOCUMENTS

| 5,448,083 | A * | 9/1995 | Kitagawa et al. ............. 257/139 |
| 5,614,750 | A | 3/1997 | Ellul et al. |
| 6,429,477 | B1 | 8/2002 | Mandelman et al. |
| 6,689,695 | B1 * | 2/2004 | Lui et al. .................. 438/700 |
| 7,485,926 | B2 | 2/2009 | Richter et al. |
| 2002/0053715 | A1 * | 5/2002 | Kim et al. .................. 257/524 |
| 2003/0094654 | A1 * | 5/2003 | Christensen et al. ........ 257/347 |
| 2003/0193077 | A1 | 10/2003 | Fujii |
| 2004/0262659 | A1 * | 12/2004 | Matsubara ................. 257/301 |
| 2006/0176211 | A1 * | 8/2006 | Mohamadi .................. 342/51 |

FOREIGN PATENT DOCUMENTS

| DE | 197 02 121 C1 | 6/1998 |
| DE | 101 29 846 C1 | 11/2002 |
| DE | 103 03 643 B3 | 9/2004 |
| DE | 102 39 310 B4 | 11/2005 |
| WO | WO 2007/016446 A2 | 2/2007 |

* cited by examiner

*Primary Examiner* — Thanh V Pham
*Assistant Examiner* — Mark A Laurenzi, III
(74) *Attorney, Agent, or Firm* — Slater & Matsil, L.L.P.

(57) ABSTRACT

According to one embodiment of the present invention, a SOI device includes a first composite structure including a substrate layer, a substrate isolation layer being disposed on or above the substrate layer, a buried layer being disposed on or above the substrate isolation layer, and a semiconductor layer being disposed on or above the buried layer; a trench structure being formed within the first composite structure; and a second composite structure provided on the side walls of the trench structure, wherein the second composite structure includes a first isolation layer covering the part of the side walls formed by the semiconductor layer and formed by an upper part of the buried layer; and a contact layer covering the isolation layer and the part of the side walls formed by a lower part of the buried layer.

24 Claims, 11 Drawing Sheets

METHOD OF MANUFACTURING A SEMICONDUCTOR DEVICE, METHOD OF MANUFACTURING A SOI DEVICE, SEMICONDUCTOR DEVICE, AND SOI DEVICE

TECHNICAL FIELD

An embodiment of the present invention generally relates to a method of manufacturing a semiconductor device, a method of manufacturing a SOI device, a semiconductor device, and a SOI device.

BACKGROUND

It is an ongoing goal to increase the computational power of computing devices. In order to increase the computational power, the integration depth of the computing devices may be increased. In order to keep manufacturing costs low, manufacturing processes may be used which enable the formation of structures of high precision and, at the same time, however, keep the manufacturing effort as low as possible.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Figure 1:
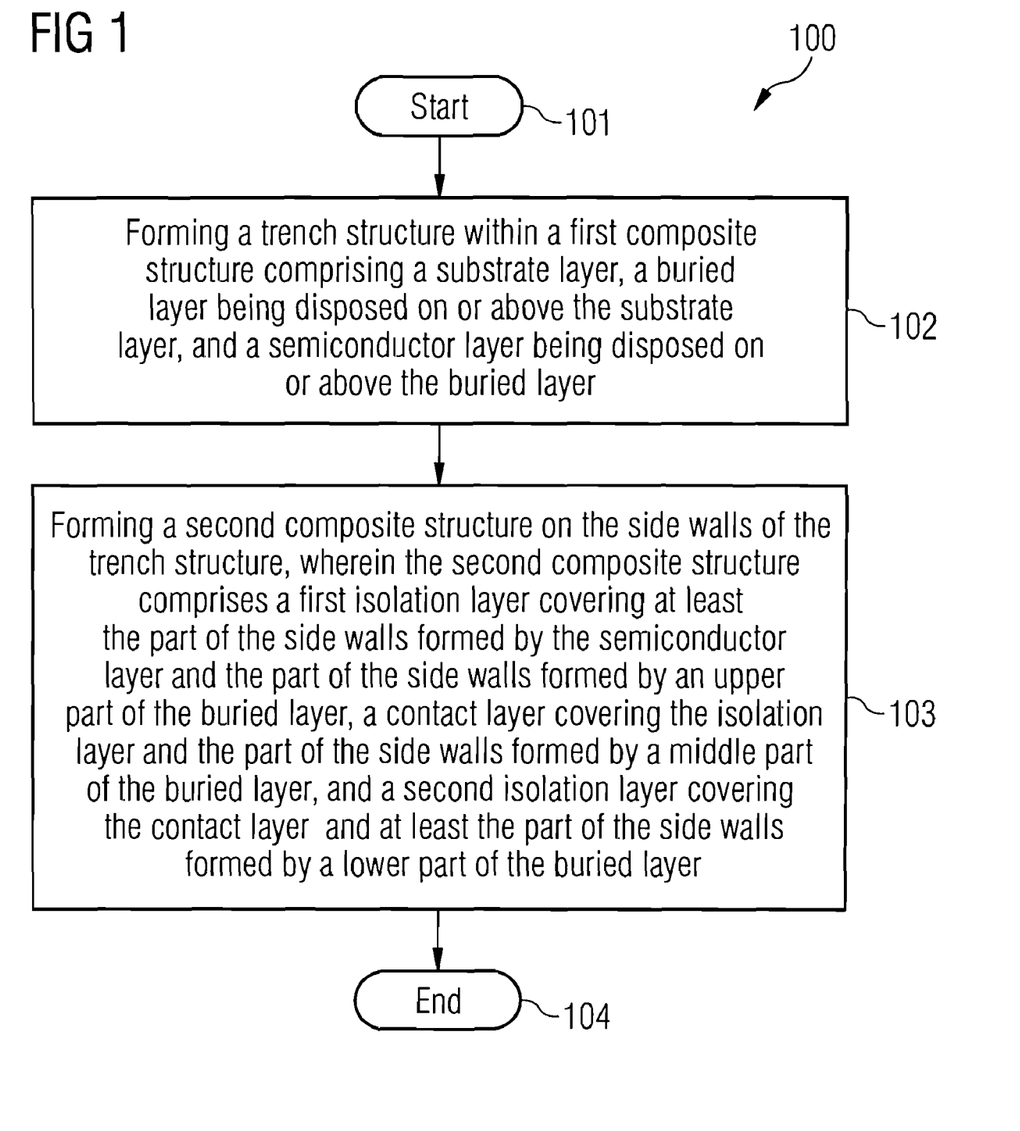
FIG. 1 shows a flow chart of a method of manufacturing a semiconductor device according to one embodiment of the present invention.

FIG. 1 shows a method 100 of manufacturing a semiconductor device according to one embodiment of the present invention.

At 101, the manufacturing method is started.

At 102, a trench structure is formed within a first composite structure including a substrate layer, a buried layer being disposed on or above the substrate layer, and a semiconductor layer being disposed on or above the buried layer.

At 103, a second composite structure is formed on the side walls of the trench structure. The second composite structure includes a first isolation layer covering at least the part of the side walls formed by the semiconductor layer and the part of the side walls formed by an upper part of the buried layer, a contact layer covering the isolation layer and the part of the side walls formed by a middle part of the buried layer, and a second isolation layer covering the contact layer and at least the part of the side walls formed by a lower part of the buried layer.

At 104, the method 100 is terminated.

The process described at 103 may be repeated several times, i.e., after having formed the second composite structure, a third composite structure may be formed on the side walls of the remaining trench structure. The third composite structure may, for example, include a second contact layer covering at least the second isolation layer (and optionally the part of the side walls formed by an upper part of a further semiconductor layer or a further buried layer disposed below the buried layer), and a third isolation layer covering the second contact layer and the part of the side walls formed by a part (e.g., a lower part) of the further semiconductor or the further buried layer. If necessary, further composite structures may be formed on the third composite structure. In this way, each contact layer contacts an individual semiconductor layer or buried layer. This means that an arbitrary number of layers of a stack of layers can be contacted by one single trench ("multi shell approach").

According to one embodiment of the present invention, the trench structure may be formed such that at 102 it extends into the substrate layer, wherein the second isolation layer is formed such that it covers the part of the side walls formed by the substrate layer.

According to one embodiment of the present invention, the second isolation layer is formed such that at 103 it covers the bottom surface of the trench structure.

According to one embodiment of the present invention, the remaining space within the trench structure is filled with filling material after having carried out step 103.

According to one embodiment of the present invention, the remaining space within the trench structure is filled with conductive material such that the conductive material contacts the substrate layer after having carried out 103.

Figure 2:
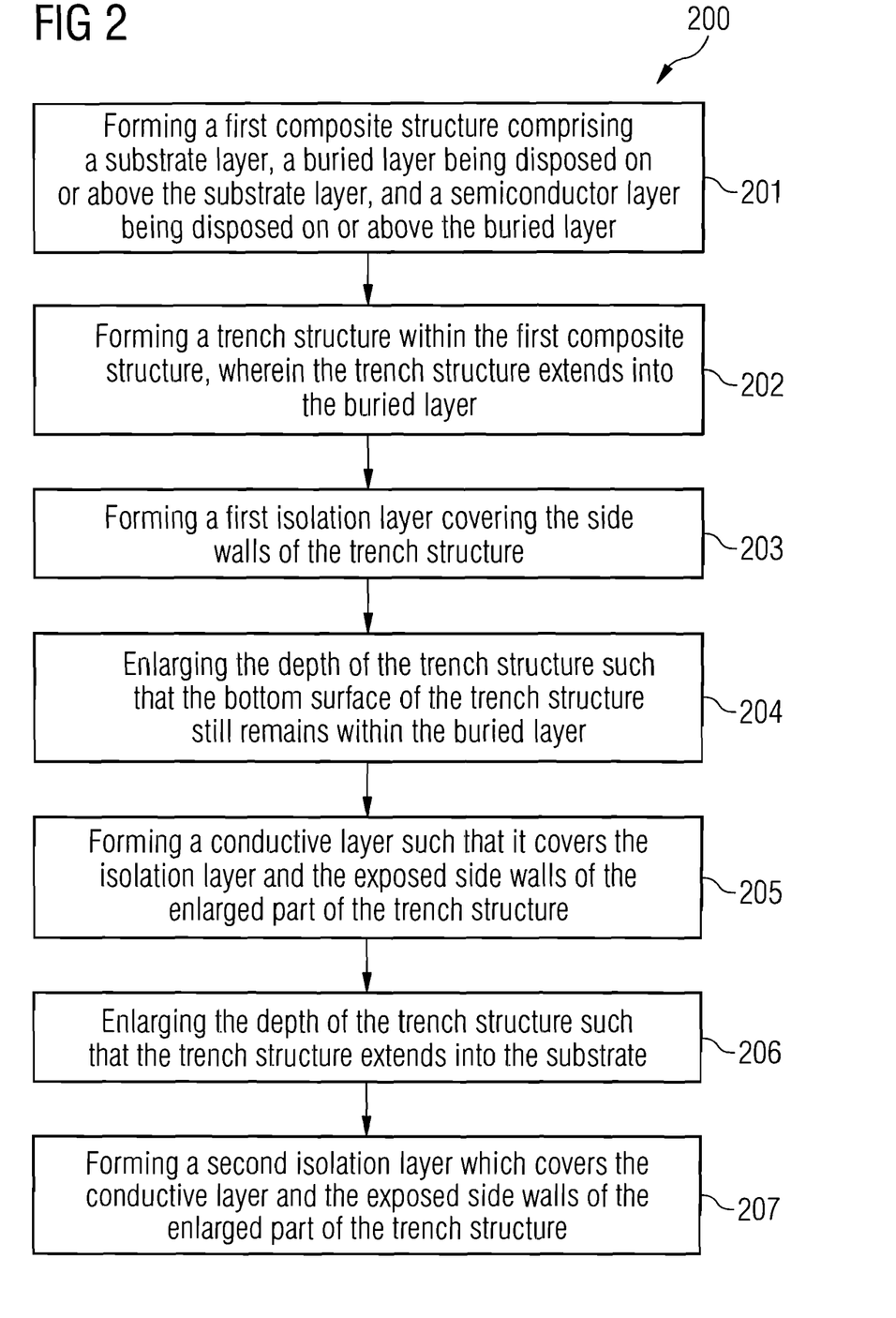
FIG. 2 shows a possible embodiment indicating how the method shown in FIG. 1 could be carried out in detail.

FIG. 2 shows a method 200 illustrating how the method 100 could be carried out in detail.

At 201, a first composite structure including a substrate layer, a buried layer being disposed on or above the substrate layer, and a semiconductor layer being disposed on or above the buried layer is formed.

At 202, a trench structure is formed within the first composite structure, wherein a trench structure extends into the buried layer.

At 203, a first isolation layer covering the side walls of the trench structure is formed.

At 204, the depth of the trench structure is enlarged such that the bottom surface of the trench structure still is located within the buried layer.

At 205, a conductive layer is formed such that it covers the isolation layer and the exposed side walls of the enlarged parts of the trench structure.

At 206, the depth of the trench structure is enlarged such that the trench structure extends into the substrate.

At 207, a second isolation layer is formed which covers the conductive layer and the exposed side walls of the enlarged part of the trench structure.

According to one embodiment of the present invention, a first isolation layer is formed at 203 using a thermal oxidization treatment that causes the side walls of the trench structure to be thermally oxidized. The first isolation layer may also be formed using a deposition process.

According to one embodiment of the present invention, in order to form or enlarge the trench structure at 202, 204 and 206, an etching process is used.

Figure 3:
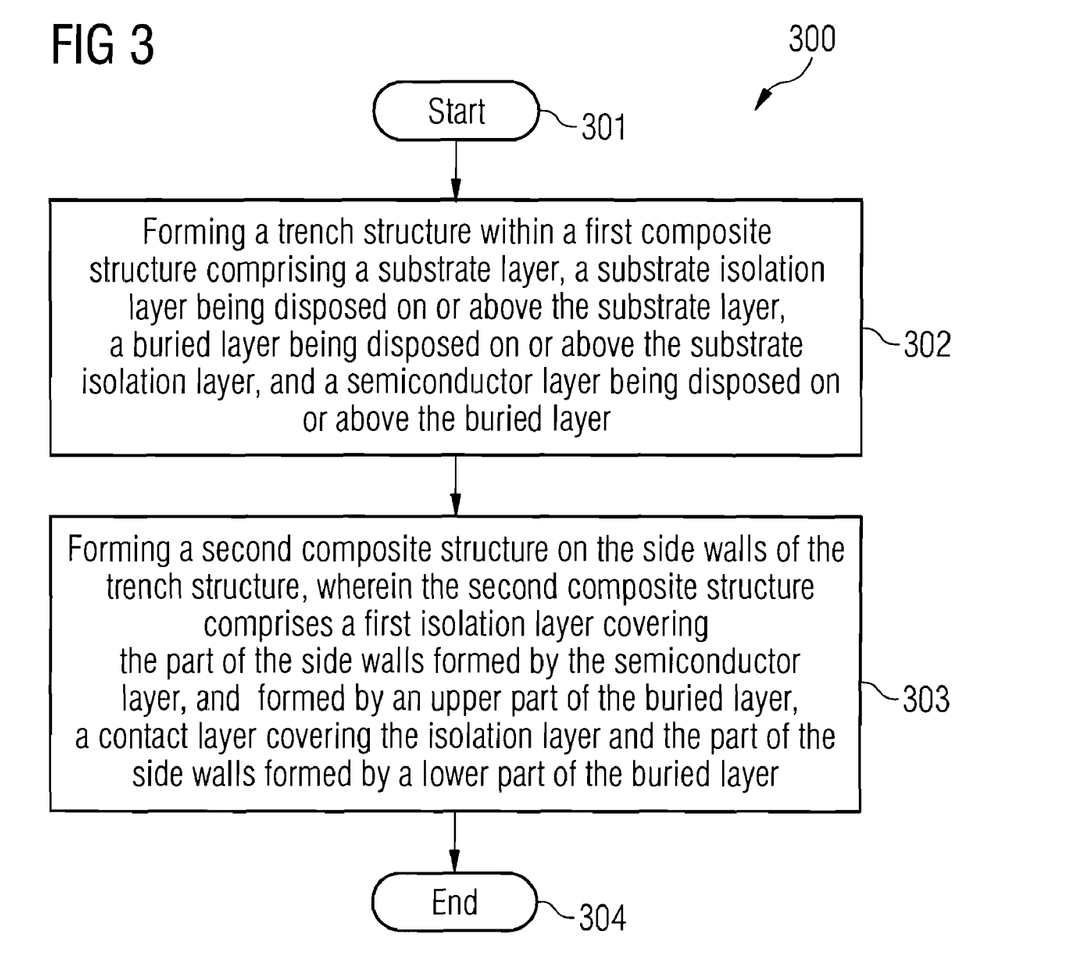
FIG. 3 shows a flow chart of a method of manufacturing a SOI device according to one embodiment of the present invention.

FIG. 3 shows a method 300 of manufacturing a SOI (silicon on insulator) device according to one embodiment of the present invention.

At 301, the method is started.

At 302, a trench structure is formed within a first composite structure including a substrate layer, a substrate isolation layer being disposed on or above the substrate layer, a buried layer being disposed on or above the substrate isolation layer, and a semiconductor layer being disposed on or above the buried layer.

At 303, a second composite structure is formed on the side walls of the trench structure, wherein the second composite structure includes: a first isolation layer covering the part of the side walls formed by the semiconductor layer, and formed by an upper part of the buried layer; a contact layer covering the isolation layer and the part of the side walls formed by a lower part of the buried layer.

At 304, the method is terminated.

The process described at 303 may be repeated several times, i.e., after having formed the second composite structure, a third composite structure may be formed on the side walls of the remaining trench structure. The third composite structure may, for example, include a second isolation layer covering the contact layer (and optionally the part of the side walls formed by an upper part of a further semiconductor layer or a further buried layer disposed below the buried layer), and a further contact layer covering the second isolation layer and the part of the side walls formed by a part (e.g., a lower part) of the further semiconductor or the further buried layer. If necessary, further composite structures may be formed on the third composite structure. In this way, each contact layer contacts an individual semiconductor layer or buried layer. This means that an arbitrary number of layers of a stack of layers can be contacted by one single trench.

According to one embodiment of the present invention, the trench structure is formed at 302 such that it extends to the bottom surface of the buried layer, i.e., the bottom surface of the trench structure coincides with the bottom surface of the buried layer.

According to one embodiment of the present invention, the second isolation layer is generated such that at 303 that it covers the conductive layer.

According to one embodiment of the present invention, the remaining space within the trench structure is filled with filling material after having carried out at 303.

According to one embodiment of the present invention, after having carried out at 303, the remaining space within the trench structure is filled with conductive material which extends through the substrate isolation layer into the substrate layer.

Figure 4:
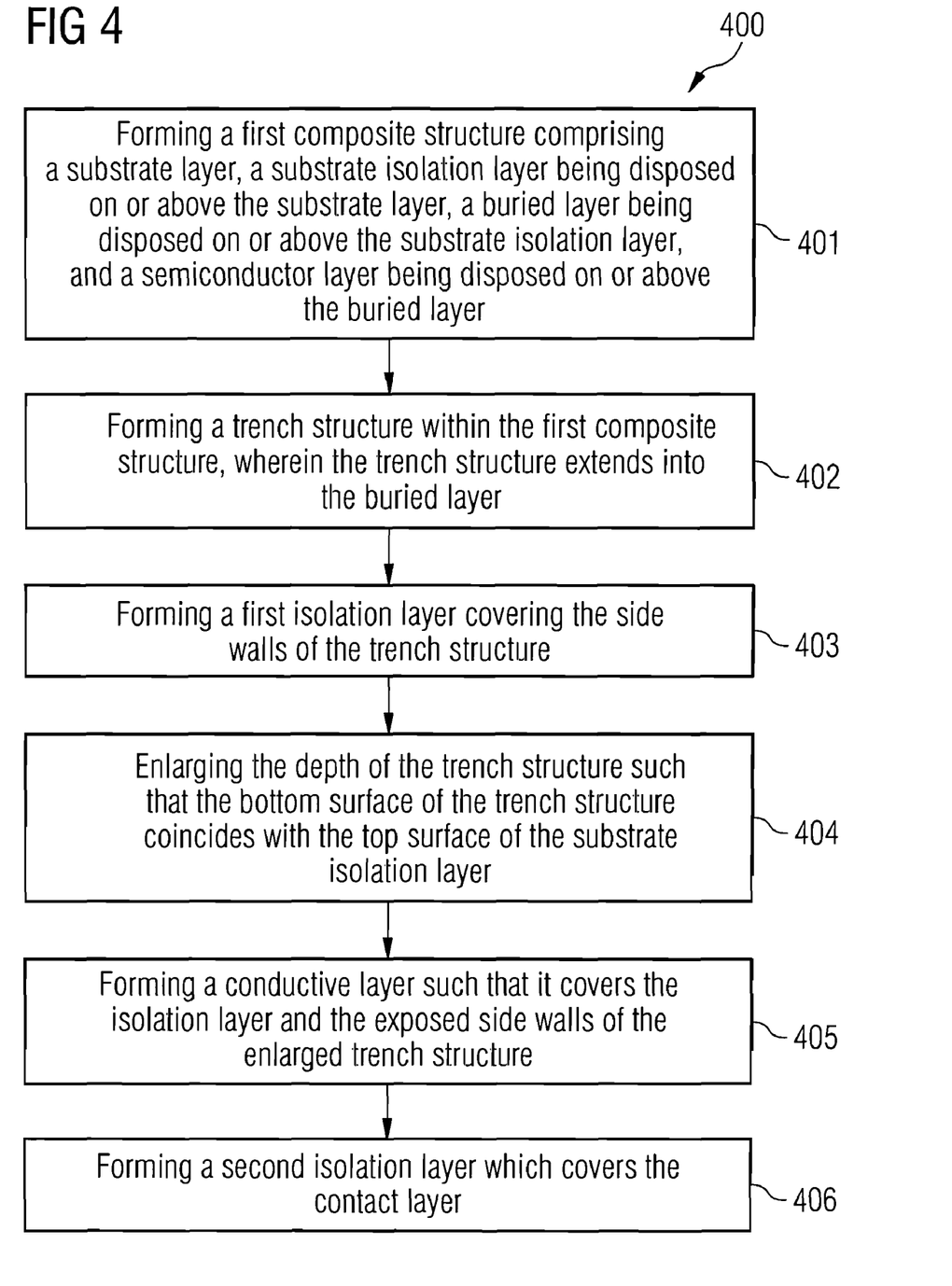
FIG. 4 shows a flow chart of a method of manufacturing a SOI device according to one embodiment of the present invention.

FIG. 4 shows a method 400 illustrating how the method 300 shown in FIG. 3 could be carried out in detail.

At 401, a first composite structure is formed including a substrate layer, a substrate isolation layer being disposed on or above the substrate layer, a buried layer being disposed on or above the substrate isolation layer, and a semiconductor layer being disposed on or above the buried layer.

At 402, a trench structure is formed within the first composite structure, wherein the trench structure extends into the buried layer.

At 403, a first isolation layer is formed covering the side walls of the trench structure.

At 404, the depth of the trench structure is enlarged such that the bottom surface of the trench structure coincides with the top surface of the substrate isolation layer.

At 405, a conductive layer is formed such that it covers the isolation layer and the exposed side walls of the enlarged trench structure.

At 406, a second isolation layer is formed which covers the contact layer.

According to one embodiment of the present invention, after having carried out 405, the depth of the trench structure is enlarged such that the trench structure extends into the substrate, wherein the substrate layer is contacted by filling remaining space within the trench structure with conductive material.

According to one embodiment of the present invention, the first isolation layer is formed at 403 using a thermal oxidization of the side walls of the trench structure. The first isolation layer may also be formed using a deposition process.

According to one embodiment of the present invention, the generation or the enlargement of the trench structure is carried out using an etching process.

In the following description, making reference to FIGS. 5 to 11, a method of manufacturing a SOI device will be explained.

Figure 5:
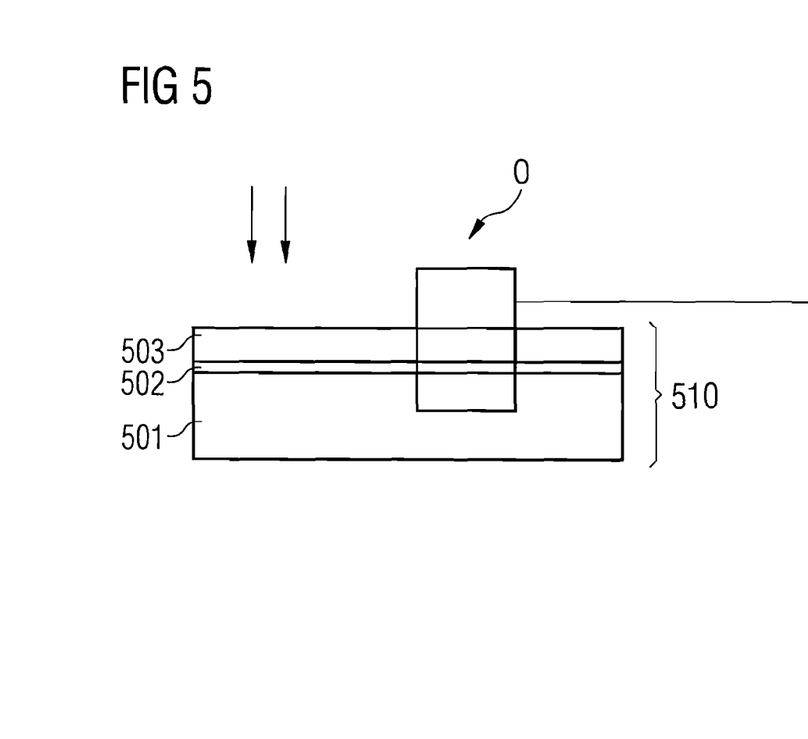
FIG. 5 shows a cross-sectional view of a processing stage of a method of manufacturing a SOI device according to one embodiment of the present invention.

FIG. 5 shows SOI base material 510 which is used as a starting point for the processing steps described in the following. The SOI base material 510 includes a semiconductor substrate layer 501, a substrate isolation layer 502 being disposed on the semiconductor substrate layer 501, and a semiconductor buried layer 503 being disposed on the substrate isolation layer 502. A magnified view of an area O is shown in FIGS. 6-11 that follow.

Figure 6:
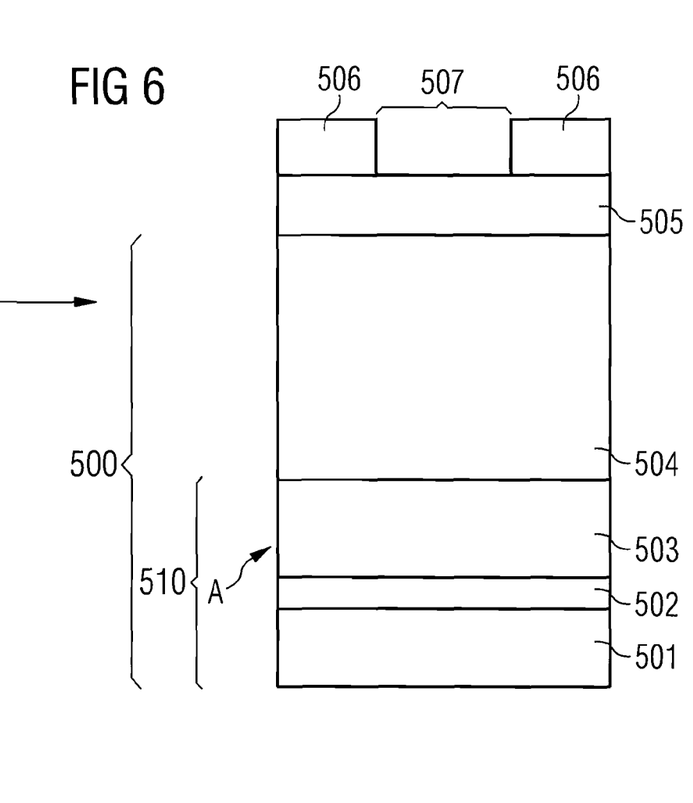
FIG. 6 shows an enlarged view of the processing stage shown in FIG. 5.

FIG. 6 shows a processing stage A in which a composite structure 500 has been formed including a semiconductor substrate layer 501, a substrate isolation layer 502 being disposed on the semiconductor substrate layer 501, a semiconductor buried layer 503 being disposed on the substrate isolation layer 502, and an EPI substrate layer 504 being disposed on the semiconductor buried layer 503. Further, a masking layer 505 and a resist layer 506 being disposed on the masking layer 505 have been provided. The resist layer 506 has been patterned (using, for example, a light exposure process), i.e., the resist layer 506 has been removed within the area denoted by reference numeral 507.

Figure 7:
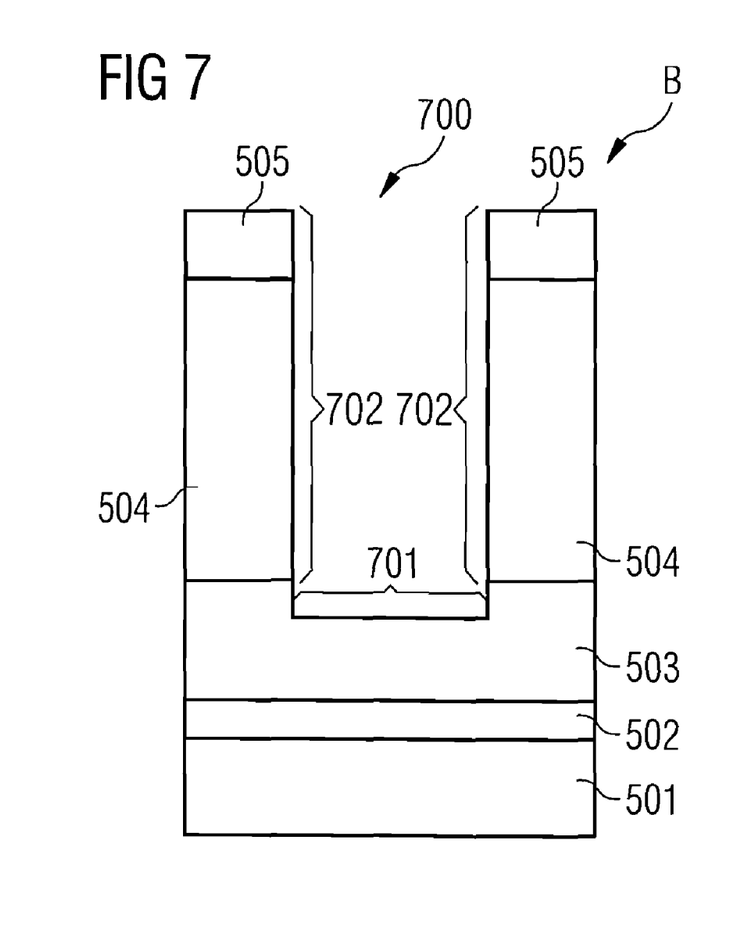
FIG. 7 shows a cross-sectional view of a processing stage of a method of manufacturing a SOI device according to one embodiment of the present invention.

FIG. 7 shows a processing stage B in which a trench structure 700 has been formed within the composite structure 500. The trench structure 700 has been formed such that its bottom surface 701 falls below the top surface of the semiconductor buried layer 503. The trench structure 700 has been formed using the structured resist layer 506 as an etching mask during an etching process. Instead of a resist layer, other layers like a hard mask layer may be used in order to form the trench structure 700. The structured resist layer 506 has been removed after having carried out the etching process.

Figure 8:
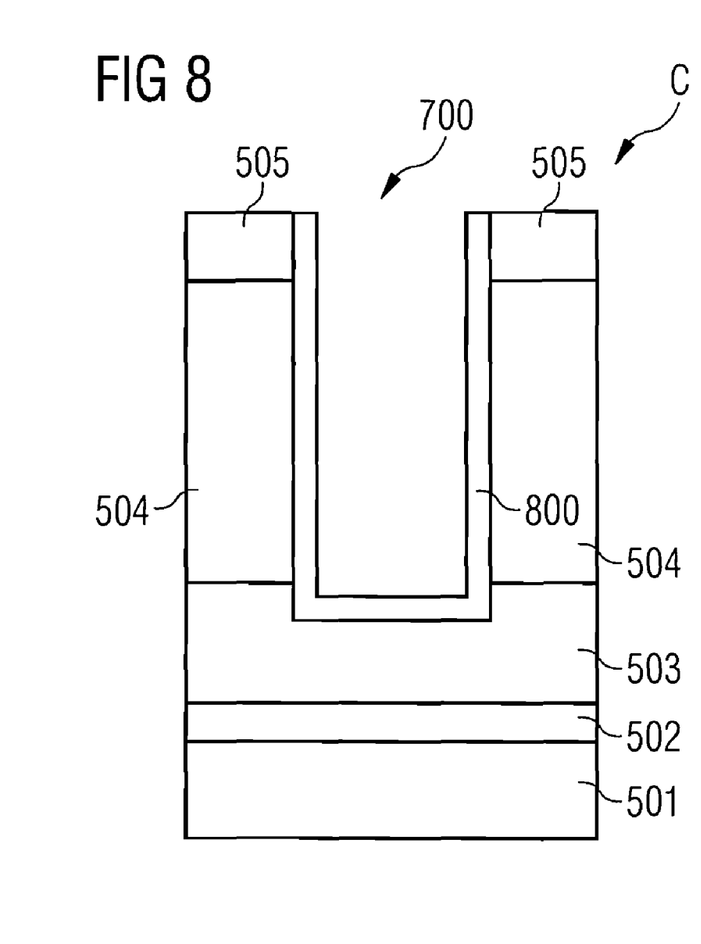
FIG. 8 shows a cross-sectional view of a processing stage of a method of manufacturing a SOI device according to one embodiment of the present invention.

In a processing stage C shown in FIG. 8, a first isolation layer 800 has been formed which covers the side walls 702 of the trench structure 700 as well as the bottom surface 701 of the trench structure 700. The first isolation layer 800 may, for example, be formed by oxidizing the side walls 702 and the bottom surface 701 of the trench structure 700, thereby converting semiconductor material into insulation material. As a consequence, the bottom surface of the first isolation layer 800 is located within the semiconductor buried layer 503.

Figure 9:
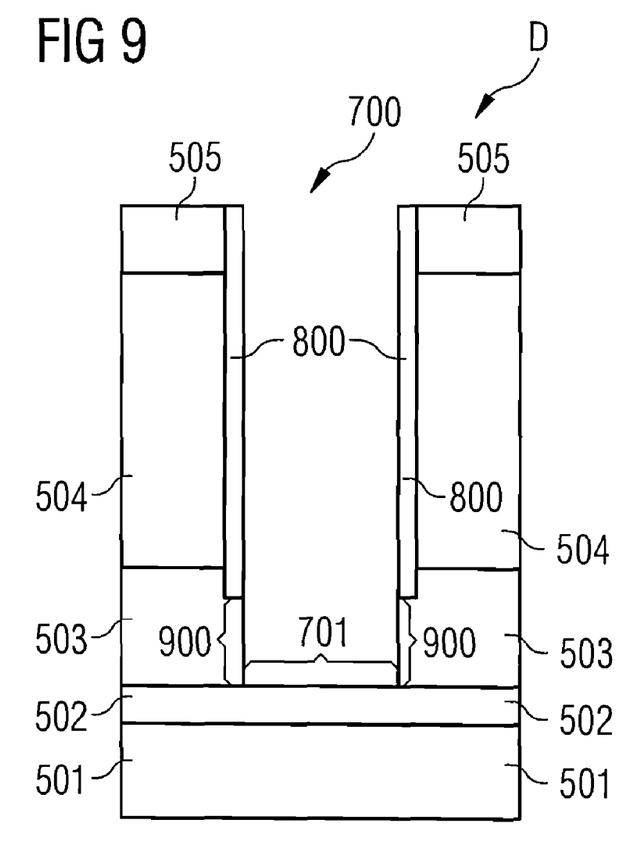
FIG. 9 shows a cross-sectional view of a processing stage of a method of manufacturing a SOI device according to one embodiment of the present invention.

FIG. 9 shows a processing stage D in which the depth of the trench structure 700 has been enlarged such that the bottom surface 701 of the enlarged trench structure 700 coincides with the top surface of the substrate isolation layer 502. The enlargement of the depth of the trench structure 700 may, for example, be carried out using an etching process or other processes.

Figure 10:
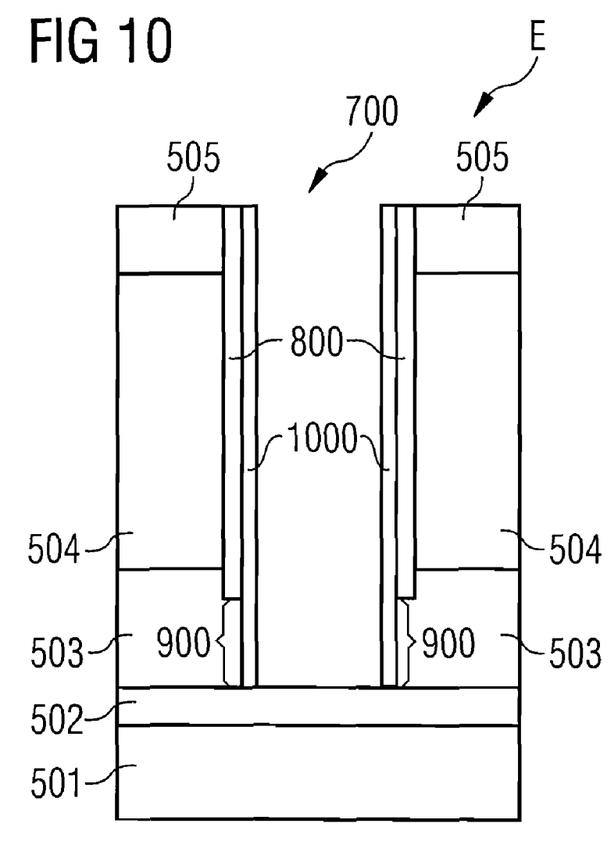
FIG. 10 shows a cross-sectional view of a processing stage of a method of manufacturing a SOI device according to one embodiment of the present invention.
Figure 11:
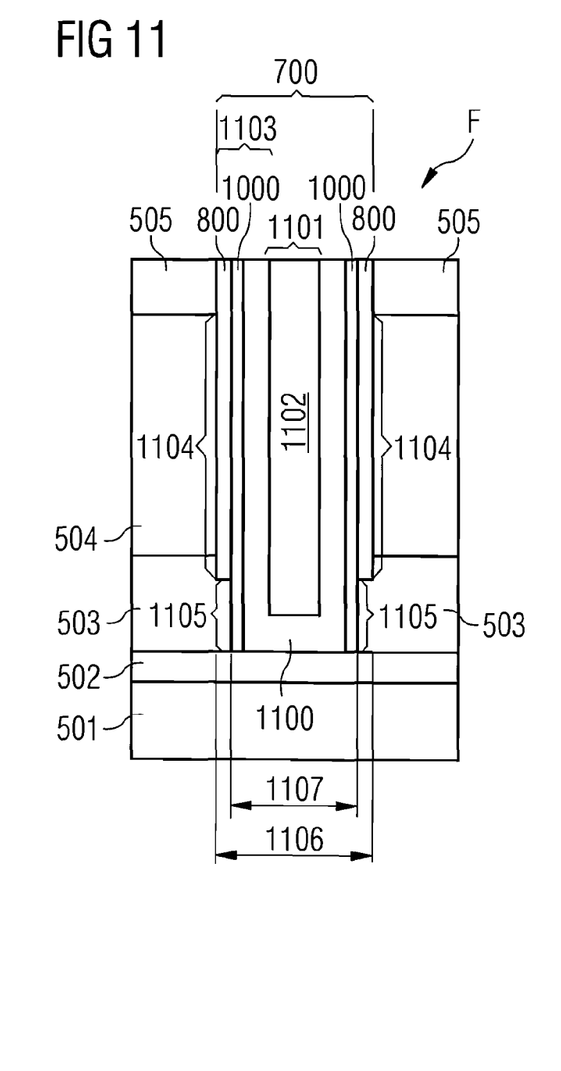
FIG. 11 shows a cross-sectional view of a processing stage of a method of manufacturing a SOI device according to one embodiment of the present invention.

FIG. 10 shows a processing stage E in which the first isolation layer 800 has been covered by a conductive layer 1000, wherein the conductive layer 1000 also covers the exposed parts 900 of the side walls of the enlarged trench structure shown in FIG. 9. The conductive layer 1000 does not cover the top surface of the substrate isolation layer 502 in order to prevent a short circuit between different side walls of the trench structure 700. The conductive layer 1000 is also known as a "sinker" or as a "buried layer contact" and may consist of materials like metal, poly silicon, or silicide. FIG. 11 shows a processing stage F in which a second isolation layer 1100 has been formed on the conductive layer 1000 and the top surface of the substrate isolation layer 502. Further, remaining space 1101 within the trench structure 700 has been filled with filling material 1102. The first isolation layer 800, the conductive layer 1000 and the second isolation layer 1100 together form a second composite structure 1103.

As can be derived from FIG. 11, the first isolation layer 800 covers the part 1104 of the side walls formed by the semiconductor layer 504, and formed by an upper part of the buried semiconductor layer 503. This ensures that no short circuit between the semiconductor layer 504 and the conductive layer 1000 exists. As a consequence, the lateral dimensions of the conductive layer 1000 covers the isolation layer 800 and the part 1105 of the side walls formed by a lower part of the buried semiconductor layer 503. Thus, the trench structure 700 as shown in FIG. 11 has a first trench gap 1106 in the upper part of the trench structure 700, and has a second trench gap 1107 in the lower part of the trench structure 700, wherein the first trench gap 1106 is larger than the second trench gap 1107.

The semiconductor buried layer 503 may be of the same or the opposite conductive type as that of the EPI substrate layer 504.

Figure 12:
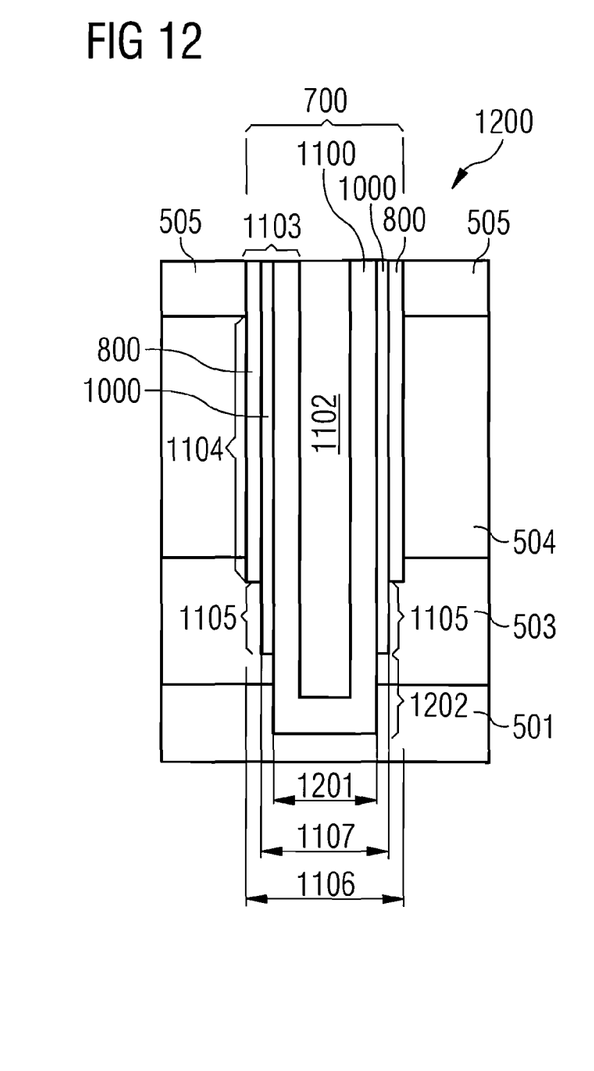
FIG. 12 shows a cross-sectional view of a semiconductor device according to one embodiment of the present invention.

FIG. 12 shows a semiconductor device 1200 according to one embodiment of the present invention. The semiconductor device 1200 has the same architecture as the SOI device shown in FIG. 11 except of the following differences: The substrate isolation layer 502 is omitted, i.e., the buried semiconductor layer 503 is directly arranged on the semiconductor substrate layer 501; further, the bottom end of the conductive layer 1000 does not coincide with the bottom surface of the buried semiconductor layer 503, but is located within the buried semiconductor layer 503, i.e., there is a distance between the bottom surface of the conductive layer 1000 and the bottom surface of the buried semiconductor layer 503; last, the bottom surface of the second isolation layer 1100 does not coincide with the bottom surface of the buried layer 503, but is located within the semiconductor substrate layer 501. As a consequence, the trench structure 700 of the semiconductor device 1200 has a first trench gap 1106, a second trench gap 1107, and a third trench gap 1201, wherein the first trench gap 1106 which is located in an upper part of the trench structure 700 is larger than the second trench gap 1107 which is located in a middle part of the trench structure 700, and wherein the second trench gap 1107 is larger than the third trench gap 1201 located in a lower part of the trench structure 700. In other words: The first isolation layer 800 covers the part 1104 of the side walls of the trench structure 700 formed by the semiconductor layer 504 and formed by an upper part of the buried semiconductor layer 503. The conductive layer 1000 covers the first isolation layer 800 and the part 1105 of the side walls formed by a middle part of the buried semiconductor layer 503. The second isolation layer 1100 covers the conductive layer 1000 and the part 1202 of the side walls of the trench structure 700 formed by a lower part of the buried semiconductor layer 503 and an upper part of the semiconductor substrate layer 501.

The semiconductor device 1200 can be manufactured similar to the SOI device shown in FIG. 11. Differences are that the bottom surface of the trench structure 700 is located above the top surface of the semiconductor substrate layer 501 before forming the conductive layer 1000, and that, after having formed the conductive layer 1000, the trench structure is enlarged a second time such that it extends into the semiconductor substrate layer 501.

Figure 13:
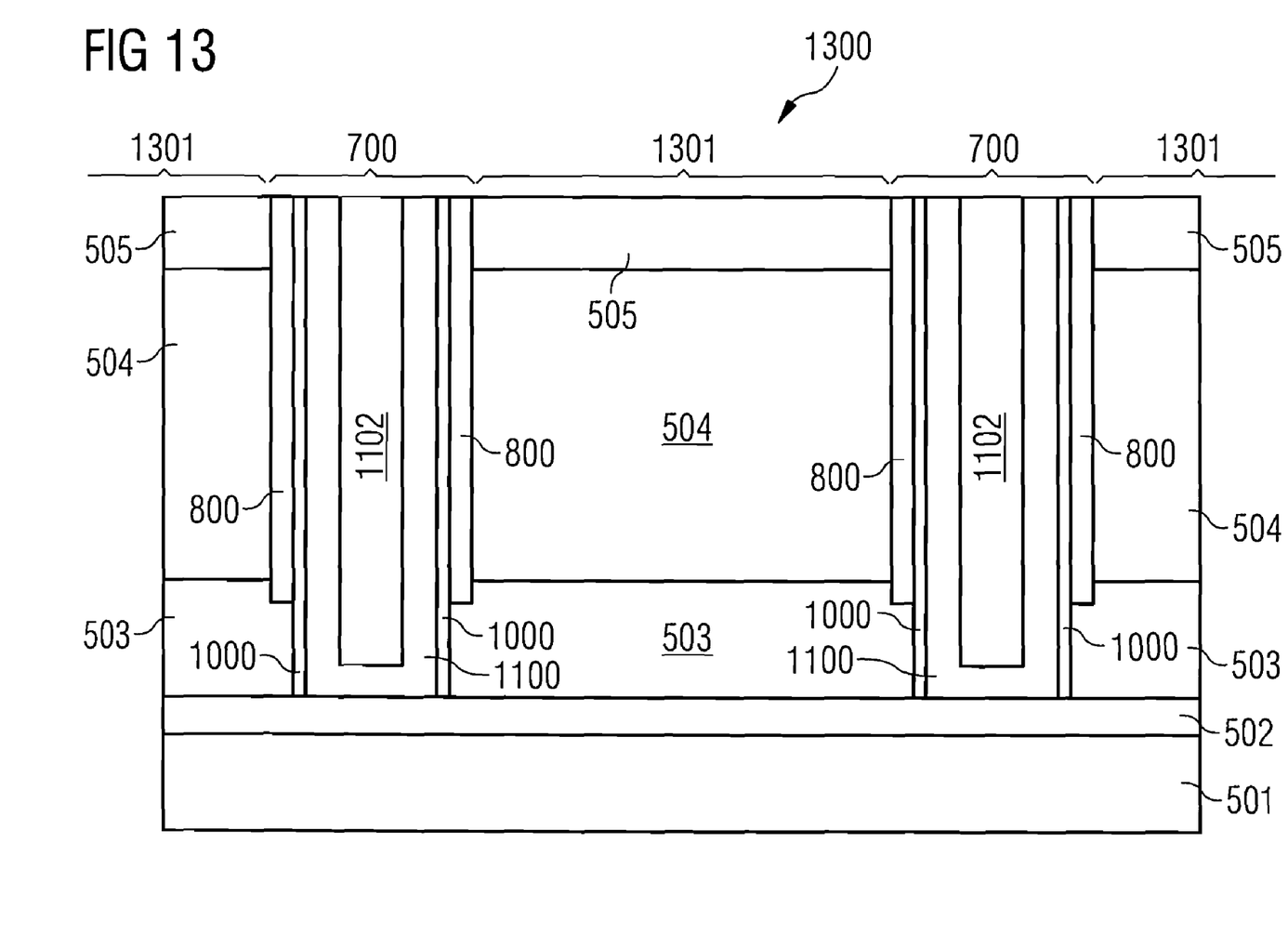
FIG. 13 shows a cross-sectional view of a SOI device according to one embodiment of the present invention.

FIG. 13 shows a SOI device 1300 including a plurality of trench structures 700 which are identical to the trench structure as shown in FIG. 11. The trench structures 700 separate the semiconductor layer 504 into semiconductor element regions 1301, wherein at least one semiconductor element may be formed within each semiconductor element region 1301. The semiconductor element regions 1301 are electrically isolated from each other by the trench structures 700.

Figure 14:
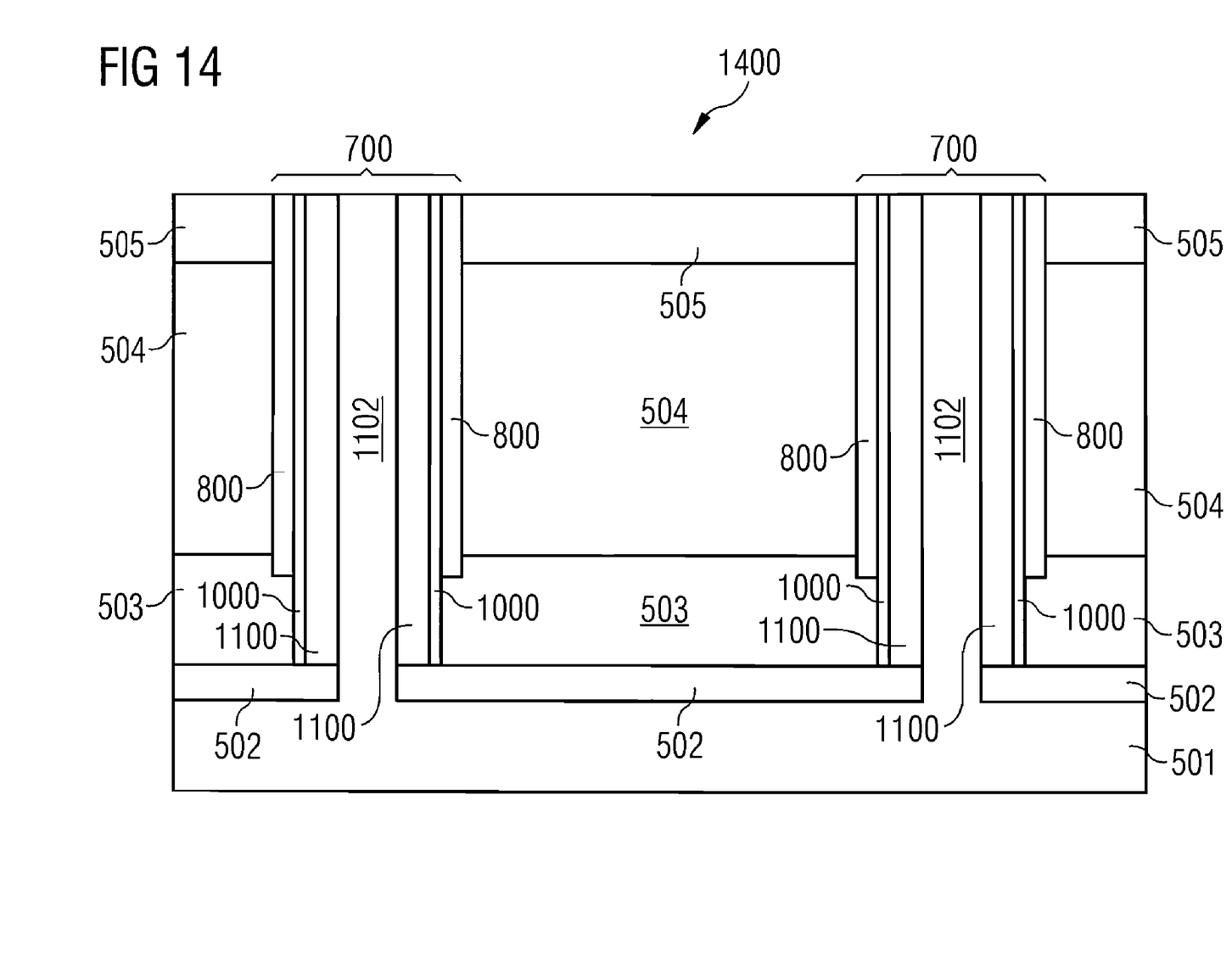
FIG. 14 shows a cross-sectional view of a SOI device according to one embodiment of the present invention.

FIG. 14 shows a further SOI device 1400 according to one embodiment of the present invention. The architecture of the SOI device 1400 is similar to the architecture of the SOI device 1300. Differences are that the filling material 1102 is not isolated against the semiconductor substrate layer 501 by the second isolation layer 1100 and the substrate isolation layer 502, but extends through the second isolation layer 1100 and the substrate isolation layer 502, thereby contacting the semiconductor substrate layer 501. That is, an electrical contact can be provided (assuming that the filling material 1102 is conductive material) which contacts the semiconductor substrate layer 501 from the top surface of the SOI device 1400. In order to manufacture the SOI device 1400, the trench structure 700 may be enlarged in order to extend through the second isolation layer 1100 and the substrate isolation layer 502 after having formed the second isolation layer 1100 (using, for example, an etching process).

The architectures shown in FIGS. 13 and 14 may also be applied to the case where the semiconductor device only includes one semiconductor element (i.e., includes only one semiconductor element region). In this case, the trench structure 700 may be used to completely or at least partly surround the single semiconductor element.

The semiconductor element may, for example, be a transistor, a diode, or a resistor.

As can be derived from FIG. 13, the first isolation layer 800 covers the part 1104 of the side walls formed by the semiconductor layer 504, and formed by an upper part of the buried semiconductor layer 503. This ensures that no short circuit between a semiconductor element formed within the semiconductor element region and the conductive layer 1000 via the semiconductor layer 504 exists. Instead, the current is "forced" to use the buried semiconductor layer 503 in order to reach the conductive layer 1000. As a consequence, the lateral dimensions between neighboring trench structures 700 can be reduced, compared to solutions which do not use the first isolation layer 800.

Figure 15:
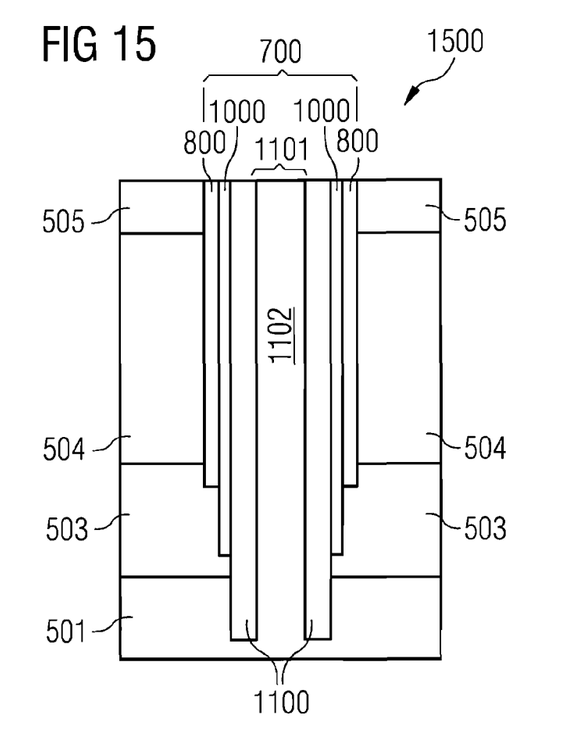
FIG. 15 shows a cross-sectional view of a semiconductor device according to one embodiment of the present invention.

FIG. 15 shows a semiconductor device 1500, the architecture of which being similar to the semiconductor device 1200 shown in FIG. 12. A difference is that the filling material 1102 directly contacts the semiconductor substrate layer 501, i.e., is not isolated against the semiconductor substrate layer 501 by the second isolation layer 1100. In order to manufacture the semiconductor device 1500, the trench structure may be enlarged in order to extend through the second semiconductor layer 1100 into the semiconductor substrate layer 501 after having formed the second isolation layer 1100. In this way, an electrical contact can be provided (assuming that the filling material 1102 is conductive material) which contacts the semiconductor substrate layer 501 from the top surface of the semiconductor device 1500.

Figure 16:
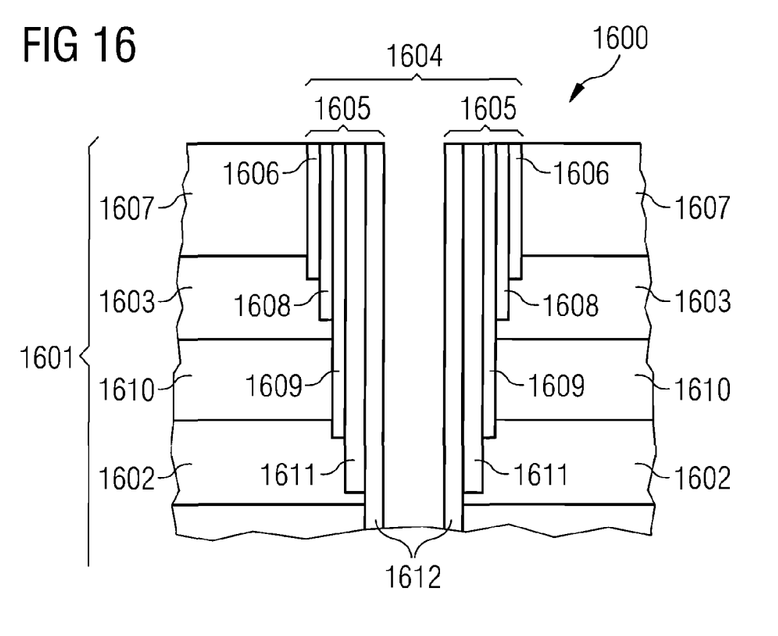
FIG. 16 shows a cross-sectional view of a semiconductor device according to one embodiment of the present invention.

FIG. 16 shows a device 1600 according to one embodiment of the present invention. The device 1600 includes: a first composite structure 1601 including a first buried layer 1602 and a second buried layer 1603 disposed above the first buried layer 1602; a trench structure 1604 formed within the first composite structure 1601; and a second composite structure 1605 being provided on the side walls of the trench structure 1604, wherein the second composite structure 1605 includes a first isolation layer 1606 covering at least the part of the side walls formed by layers 1607 disposed above the second buried layer 1603, a first contact layer 1608 covering the first isolation layer 1606 and at least a part of the side walls formed by the second buried layer 1603, a second isolation layer 1609 covering the first contact layer 1608 and at least a part of layer(s) 1610 disposed between the first buried layer 1602 and the second buried layer 1603, and a second conductive layer 1611 covering the second isolation layer 1609 and at least a part of the side walls formed by the first buried layer 1602. A third isolation layer 1612 is provided on the second conductive layer 1611.

Following the principle shown in FIG. 16, it is possible to individually contact an arbitrary number of buried layers using a composite structure of isolation layers and contacting layers which alternate with each other.

According to one embodiment of the present invention, the device is a SOI device or a semiconductor device.

According to one embodiment of the present invention, the first isolation layer 1606 extends down to the top surface of the second buried layer 1603, however does not extend into the second buried layer 1603 (in contrast to the embodiment shown in FIG. 16), and wherein the second isolation layer 1609 extends down to the top surface of the first buried layer 1602, however does not extend into the first buried layer 1602 (in contrast to the embodiment shown in FIG. 16). This may also be applied to all other embodiments of the present invention. That is, the isolation layers of the composite structures may stop on the top surfaces of the buried layers, however not extend into the buried layers.

According to one embodiment of the present invention, a method is provided to contact a buried layer and to isolate different devices in one lithography step and one trench etch process.

According to one embodiment of the present invention, a trench is used with a multi-shell structure that requires only one mask step and only one trench etch process for the realization of an isolated sinker and an isolation structure which also may provide a substrate contact. Effects of this embodiment are that the devices are completely shielded, the structure saves die area, and the thermal budget is low. The generation of sinker and isolation which use different mask steps, which are diffused from the surface, and which consume a lot of die area or used separate trench etch processes can be avoided.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An SOI device, comprising:
a first composite structure comprising:
a substrate layer,
a substrate isolation layer disposed on or above the substrate layer,
a buried layer disposed on or above the substrate isolation layer,
a semiconductor layer disposed on or above the buried layer, and
a trench structure disposed within the first composite structure,
a second composite structure disposed on side walls of the trench structure, wherein the second composite structure comprises:
a first isolation layer covering the part of the side walls formed by the semiconductor layer, and formed by an upper part of the buried layer, and
a conductive contact layer covering the first isolation layer, and covering the part of the side walls formed by a lower part of the buried layer thereby electrically contacting the part of the side walls formed by the lower part of the buried layer.

2. The SOI device according to claim 1, wherein the trench structure extends to a bottom surface of the buried layer.

3. The SOI device according to claim 1, wherein the second composite structure comprises a second isolation layer which covers a conductive layer.

4. The SOI device according to claim 1, wherein remaining space within the trench structure is filled with filling material.

5. The SOI device according to claim 1, wherein remaining space within the trench structure is filled with conductive material which extends through the substrate isolation layer into the substrate layer.

6. The SOI device according to claim 1, wherein a trench gap in the upper part of the buried layer is wider than the trench gap in the lower part of the buried layer.

7. The SOI device according to claim 1, wherein the trench structure divides the semiconductor layer into a plurality of semiconductor element regions, wherein at least one semiconductor element is formed within each semiconductor element region.

8. A device, comprising:
- a first composite structure comprising a first buried layer and a second buried layer, the second buried layer disposed above the first buried layer;
- a trench structure disposed within the first composite structure; and
- a second composite structure disposed on side walls of the trench structure, wherein the second composite structure comprises
  - a first isolation layer covering at least the part of the side walls formed by third and fourth buried layers disposed above the second buried layer,
  - a first conductive contact layer covering the first isolation layer, and covering at least a part of the side walls formed by the second buried layer thereby electrically contacting the part of the side walls formed by the second buried layer,
  - a second isolation layer covering the first contact layer and at least a part of the side walls formed by the first buried layer, and
  - a second conductive layer covering the second isolation layer, and covering at least a part of the side walls formed by the first buried layer thereby electrically contacting the part of the side walls formed by the first buried layer.

9. The device according to claim 8, wherein the first isolation layer extends down to a top surface of the second buried layer, but does not extend into the second buried layer, and wherein the second isolation layer extends down to a top surface of the first buried layer, but does not extend into the first buried layer.

10. The device according to claim 8, wherein the device is a SOI device or a semiconductor device.

11. A semiconductor device, comprising:
- a substrate layer;
- a buried layer disposed above the substrate layer;
- a semiconductor layer disposed above the buried layer;
- a trench structure disposed within the semiconductor layer and the buried layer, the trench structure having side walls formed by the semiconductor layer, an upper portion of the buried layer, a middle portion of the buried layer and a lower portion of the buried layer;
- a first isolation layer within the trench structure covering at least a portion of the side walls formed by the semiconductor layer and by the upper portion of the buried layer;
- a conductive contact layer covering the first isolation layer, and covering the side walls formed by the middle portion of the buried layer thereby electrically contacting the side walls formed by the middle portion of the buried layer; and
- a second isolation layer covering the contact layer and at least a portion of the side walls formed by the lower portion of the buried layer.

12. The semiconductor device according to claim 11, wherein the trench structure extends into the substrate layer, and wherein the second isolation layer covers side walls of the trench structure formed by the substrate layer.

13. The semiconductor device according to claim 11, wherein the second isolation layer covers a bottom surface of the trench structure.

14. The semiconductor device according to claim 11, further comprising a filling material that fills a remaining space within the trench structure.

15. The semiconductor device according to claim 14, wherein the filling material comprises a conductive material that contacts the substrate layer.

16. The semiconductor device according to claim 11, wherein a trench gap in the upper portion of the buried layer is wider than a trench gap in the middle portion of the buried layer, and wherein the trench gap within the middle portion of the buried layer is wider than a trench gap within the lower portion of the buried layer.

17. The semiconductor device according to claim 11, wherein the trench structure divides the semiconductor layer into a plurality of semiconductor element regions, the device further comprising at least one semiconductor element disposed within each semiconductor element region.

18. A semiconductor device, comprising:
- a first composite structure comprising a substrate layer, a buried layer disposed on or above the substrate layer, and a semiconductor layer disposed on or above the buried layer;
- a trench structure disposed within the first composite structure; and
- a second composite structure disposed on side walls of the trench structure, wherein the second composite structure comprises:
  - a first isolation layer covering at least the part of the side walls formed by the semiconductor layer and the part of the side walls formed by an upper part of the buried layer,
  - a conductive contact layer covering the first isolation layer, and covering the part of the side walls formed by a middle part of the buried layer thereby electrically contacting the part of the side walls formed by the middle part of the buried layer, and
  - a second isolation layer covering the contact layer and at least the part of the side walls formed by a lower part of the buried layer.

19. The semiconductor device according to claim 18, wherein the trench structure extends into the substrate layer, and wherein the second isolation layer covers the part of the side walls formed by the substrate layer.

20. The semiconductor device according to claim 18, wherein the second isolation layer covers a bottom surface of the trench structure.

21. The semiconductor device according to claim 18, wherein remaining space within the trench structure is filled with filling material.

22. The semiconductor device according to claim 18, wherein remaining space within the trench structure is filled with conductive material which contacts the substrate layer.

23. The semiconductor device according to claim 18, wherein a trench gap in the upper part of the buried layer is wider than a trench gap in the middle part of the buried layer, and wherein the trench gap within the middle part of the buried layer is wider than a trench gap within the lower part of the buried layer.

24. The semiconductor device according to claim 18, wherein the trench structure divides the semiconductor layer into a plurality of semiconductor element regions, wherein at least one semiconductor element is formed within each semiconductor element region.

* * * * *